United States Patent [19]

Okamoto

[11] Patent Number: 5,546,035

[45] Date of Patent: Aug. 13, 1996

[54] LATCH CIRCUIT HAVING A LOGICAL OPERATION FUNCTION

[75] Inventor: Fuyuki Okamoto, Tokyo, Japan

[73] Assignee: NEC Corporation, Tokyo, Japan

[21] Appl. No.: 390,044

[22] Filed: Feb. 17, 1995

[30] Foreign Application Priority Data

Feb. 17, 1994 [JP] Japan .................................. 6-020049

[51] Int. Cl.⁶ .................................................. H03K 3/037
[52] U.S. Cl. ........................ 327/208; 327/201; 327/214; 327/225
[58] Field of Search .................................. 327/199, 200, 327/201, 202, 203, 208, 210, 211, 212, 214, 225

[56] References Cited

U.S. PATENT DOCUMENTS

| | | | |
|---|---|---|---|
| 3,739,193 | 6/1973 | Pryor | 327/210 |
| 4,631,420 | 12/1986 | Hollis et al. | 327/201 |
| 4,692,635 | 9/1987 | Rapp | 327/208 |
| 5,111,078 | 5/1992 | Miyamoto et al. | 327/201 |
| 5,173,626 | 12/1992 | Kudou et al. | 327/211 |
| 5,175,447 | 12/1992 | Kawasaki et al. | 327/211 |

FOREIGN PATENT DOCUMENTS

| | | |
|---|---|---|
| 3-204219 | 9/1991 | Japan . |
| 3-238914 | 10/1991 | Japan . |
| 3-69447 | 11/1991 | Japan . |
| 5-6371 | 1/1993 | Japan . |

*Primary Examiner*—Timothy P. Callahan
*Assistant Examiner*—My-Trang Nu Ton
*Attorney, Agent, or Firm*—Foley & Lardner

[57] ABSTRACT

A latch circuit with an NAND function comprises a three-input NAND gate circuit, a first transfer gate connected between a first input terminal and a first input of the NAND gate circuit, a second transfer gate connected between a second input terminal and a second input of the NAND gate circuit, and a third transfer gate connected between a third input terminal and a third input of the NAND gate circuit. An input of a feedback inverter is connected To an output of the NAND gate circuit, and an output of the feedback inverter is connected to the first input of the NAND gate circuit through a fourth transfer gate. The second and third inputs of the NAND gate circuit are pulled up to a logical high level through P-channel MOS transistors. The first, second, third and fourth transfer gates and the P-channel MOS transistors are controlled by a clock signal in such a manner that when the first, second and third transfer gates are on, the fourth transfer gate and the P-channel MOS transistors are off, so that the NAND gate circuit performs a NAND operation in response to input signals applied to the first, second and third input terminals, and when the first, second and third transfer gates are off, the third transfer gate and the P-channel MOS transistors are on, so that a latch operation is performed to maintain a logical value on the output of the NAND gate circuit.

7 Claims, 6 Drawing Sheets

L ····· LOW LEVEL
H ····· HIGH LEVEL

LATCH CIRCUIT HAVING A LOGICAL OPERATION FUNCTION

BACKGROUND OF THE INVENTION

1. Field of the Invention

The present invention relates to a latch circuit, and more specifically to a latch circuit having a logical operation function.

2. Description of Related Art

A latch circuit is one of fundamental circuits used in various electronic circuits including a memory, an arithmetic and logic unit, and others.

Referring to FIG. 1, there is shown a circuit diagram of a typical latch circuit in the prior art. The shown latch circuit includes an inverter 310 having an input receiving an input signal 302 through a transfer gate 320, which is controlled by a pair of complementary clock signals. CK 300 and $\overline{CK}$ 301. An output of the inverter 301 is connected to an input of another inverter 312, having an output for outputting an output signal 303. The output of the inverter 310 is also connected to an input of still another inverter 311. An output of the inverter 311 is connected to the input of the inverter 310 through another transfer gate 321, which is controlled by the pair of complementary clock signals CK 300 and $\overline{CK}$ 301.

This latch circuit operates as follows: When the clock signal CK 300 is at a low level L (and therefore the clock signal $\overline{CK}$ 301 is at a high level H), the transfer gate 320 is opened, namely turned on, and therefore, the input signal 302 pass through the inverters 310 and 312 to be outputted as the output signal 303.

When the clock signal CK is brought to a high level H, the transfer gate 320 is turned off, and the transfer gate 321 is turned on. As a result, a loop is formed of the inverters 310 and 311 so that the value of the output signal 303 just before the rising of the clock signal CK 300 is held.

Referring to FIG. 2, there is shown a circuit diagram of one example of an electronic circuit incorporating the prior art latch circuit shown in FIG. 1.

The shown electronic circuit includes first, second and third prior art latch circuits 410, 411 and 412, each of which is the same as that shown in FIG. 1, and is controlled by a pair of complementary clock signals CK 400 and $\overline{CK}$ 401. The first, second and third prior art latch circuits 410, 411 and 412 latch first, second and third input signals 402, 403 and 404, respectively. Outputs of the first, second and third prior art latch circuits 410, 411 and 412 are connected to three inputs of a three-input NAND gate circuit 440.

As well known to persons skilled in the art, if the NAND gate circuit 440 is formed of a CMOS circuit, it includes first, second and third N-channel MOS transistors 450, 451 and 452 connected in series between an output node 470 and ground, and first, second and third P-channel MOS transistors 460, 461 and 462 connected in parallel between a high voltage terminal VDD and the output node 470. Gates of the first N-channel MOS transistor 450 and the first P-channel MOS transistor 460 are connected to the output of the first prior art latch circuit 410, and gates of the second N-channel MOS transistor 451 and the second P-channel. MOS transistor 461 are connected to the output of the second prior art latch circuit 411. In addition, gates of the third N-channel MOS transistor 452 and the third P-channel MOS transistor 462 are connected to the output of the third prior art latch circuit 412.

When the clock signal CK 400 is at a low level, the first, second and third input signals 402, 403 and 404 pass through the first, second and third prior art latch circuits 410, 411 and 412, respectively, so that the first, second and third input signals 402, 403 and 404 are applied without modification to the inputs of the three-input NAND gate circuit 440, with the result that the NAND gate circuit 440 outputs an NAND (negated logical product) of the three input signals.

At the moment the clock signal CK 400 is brought to a high level, logical values of the three input signals are latched in the three latch circuits 410, 411 and 412, respectively. Accordingly, during a period in which the clock signal CK 400 is at the high level, the output of the three-input NAND gate circuit 440 continues to maintain the same logical value.

Here, it is to be noted that the above mentioned example is simply one example, and therefore, the output of the latch circuits may be connected to a two-input NAND gate circuit or may be connected to a NOR gate circuit. However, for simplification of the succeeding explanation, description will be made on a case that the output of the latch circuits may be connected to a three-input NAND gate circuit.

Referring to FIG. 3, there is shown a circuit diagram of a latch circuit with logical operation function, which corresponds in function to three latch circuits and a three-input NAND gate circuit connected thereto. In this specification, the latch circuit with the logical operation function shown in FIG. 3 will be called a "conventional latch circuit with logical operation function".

The shown latch circuit has a function of a three-input NAND circuit and a function of a latch circuit. First, second and third input signals 502, 503 and 504 am supplied to first, second and third inputs 505, 506 and 507 of a three-input NAND circuit 510 through first, second and third transfer gates 520, 521 and 522, respectively, which are controlled by a pair of complementary clock signals CK 500 and $\overline{CK}$ 501. An output 508 of the three-input NAND circuit 510 is connected to an input of a feedback inverter 511, which in rum has an output connected to the first, second and third inputs 505, 506 and 507 of the three-input NAND circuit 510 through fourth, fifth and sixth transfer gates 523, 524 and 525, respectively. These fourth, fifth and sixth transfer gates 523, 524 and 525 are controlled by the pair of complementary clock signals CK 500 and $\overline{CK}$ 501 in such a manner that when the first, second and third transfer gates 520, 521 and 522 are opened or turned on, the fourth, fifth and sixth transfer gates 523, 524 and 525 are closed or turned off, and when the first, second and third transfer gates 520, 521 and 522 are closed or turned off, the fourth, fifth and sixth transfer gates 523, 524 and 525 are opened or turned on.

The three-input NAND circuit 510 is formed of first, second and third N-channel MOS transistors 550, 551 and 552 and first, second and third P-channel MOS transistors 560, 561 and 562, completely similarly to the three-input NAND circuit 410 shown in FIG. 2.

When the clock signal CK 500 is at a low level, the first, second and third input signals 502, 503 and 504 pass through the first, second and third transfer gates 520, 521 and 522 to be applied to the first, second and third inputs 505, 506 and 507 of the three-input NAND circuit 510, so that the three-input NAND circuit 510 outputs an NAND of the three input signals 502, 503 and 504.

When the clock signal CK 500 is brought to a high level, the first, second and third transfer gates 520, 521 and 522 are turned off, and the fourth, fifth and sixth transfer gates 523,524 and 525 are turned on. As a result, there is formed a feedback loop from the output 508 of the three-input NAND circuit 510 through the inverter 511 to the first, second and third inputs 505,506 and 507 of the three-input NAND circuit 510. Namely, an inverted signal of the output 508 of the three-input NAND circuit 510 is fed back to the first, second and third inputs 505, 506 and 507 of the three-input NAND circuit 510. Accordingly, the output of the three-input NAND circuit 510 is latched.

Thus, the NAND function at the outside of the latch circuits in the example shown in FIG. 2, is internally realized in the latch circuit. If the "conventional latch circuit with logical operation function" is used in place of the circuit construction shown in FIG. 2, the signal propagation time can be shortened by a delay time corresponding to the two inverter stages in the latch circuit (See JP-A-03-238914).

However, the "conventional latch circuit with logical operation function" has the following disadvantage: Here, consider a timing pattern as shown in FIG. 4.

Consider a situation that the first, second and third input signals change from "L, H, H" to "H, H, H" during a high level period (latched period) of the clock signal CK as shown in the timing chart shown in FIG. 4. First, during the high level period of the clock signal CK, the three-input NAND gate circuit 510 outputs a high level (H) as a negated logical product of "L, H, H". Therefore, all the N-channel MOS transistors 550, 551 and 552 of the three-input NAND gate circuit 510 are off. When the clock signal CK is brought to a low level (L), the three-input NAND gate circuit 510 outputs a low level output signal (L) in response to the first, second and third input signals change of "H, H, H". At this time, all the N-channel MOS transistors 550,551 and 552 of the three-input NAND gate circuit 510 are turned on.

On the other hand, also consider that a signal pattern shown in FIG. 4 is applied to the conventional latch and NAND gate circuit as shown in FIG. 2. When the clock signal CK 400 is at the high level (H), the first, second and third prior art latch circuits 410, 411 and 412 latch "L, H, H", respectively, in accordance with the first, second and third input signals of "L, H, H". At this time, the second and third N-channel MOS transistors 451 and 452 are on, and the first N-channel MOS transistor 450 is off. Therefore, when the clock signal CK 400 is brought to a low level. (L), the output of the first prior art latch circuit 410 changes from the low level (L) to the high level (H) in response to the first input signal of "H", so that the first N-channel MOS transistor 450 is turned on.

As seen from the above, in the circuit shown in FIG. 2, when the input signals change as shown in FIG. 4, since two of the three series-connected N-channel MOS transistors in the three-input NAND gate are already on, only one of the three series-connected N-channel MOS transistors is turned on. In the "conventional latch circuit with logical operation function" shown in FIG. 3, however, all the three series-connected N-channel MOS transistors in the three-input NAND gate are turned on. Accordingly, the NAND gate of FIG. 3 has a delay time longer than that of the NAND gate of FIG. 2. Therefore, the "conventional latch circuit with logical operation function" can eliminate the delay caused by the two cascaded inverters 310 and 312 included in the prior art latch circuit, but the operation speed of the NAND gate itself is low. Because of this, although the logical operation function is realized in the latch circuit, the operation cannot be sufficiently speeded up.

SUMMARY OF THE INVENTION

Accordingly, it is an object of the present invention to provide a latch circuit with logical operation function which has overcome the above mentioned defect of the conventional one.

Another object of the present invention is to provide an improved latch circuit with logical operation function, configured to shorten the delay time of the logic gate circuit itself.

The above and other objects of the present invention are achieved in accordance with the present invention by a latch circuit with logical operation function, comprising:

a first input terminal for receiving a first input signal;

a second input terminal for receiving a second input signal;

a logical gate circuit having a first input and a second input and an output for outputting a negated logical combination of the first input and the second input;

a first transfer gate connected between the first input terminal and the first input of the logical gate circuit;

a second transfer gate connected between the second input terminal and the second input of the logical gate circuit;

an inverter having an input connected to the output of the logical gate circuit;

a third transfer gate connected between an output of the inverter and the first input of the logical gate circuit, and a fourth transfer gate connected between the second input of the logical gate circuit and a predetermined logical level voltage, the first, second, third and fourth transfer gates being controlled by a clock signal in such a manner that when the first and second transfer gates are on, the third and fourth transfer gates are off, and when the first and second transfer gates am off, the third and fourth transfer gates are on, whereby when the first and second transfer gates are on and the third and fourth transfer gates are off, the logical gate circuit performs a predetermined logical operation in response to the first input signal applied to the first input terminal and the second input signal applied to the second input terminal, and when the first and second transfer gates are off and the third and fourth transfer gates are on, a latch operation is performed to maintain a logical value on the output of the logical gate circuit.

In this specification, the terms "negated logical combination" is used to include an NAND logic and a NOR logic but not include a simple NOT logic.

In the "conventional latch circuit with logical operation function" as shown in FIG. 3, when the three-input NAND gate circuit performs a pull-down operation of the output, since the three series-connected. N-channel MOS transistors 550, 551 and 552 are simultaneously turned on, a serial resistance is large, and therefore, a delay time is long.

In the latch circuit with logical operation function in accordance with the present invention, on the other hand, when the circuit is in a latch condition, only one of the inputs of the logical gate circuit for the negated logical combination is connected to a feedback loop, and the other of the inputs of the logical gate circuit is connected to the predetermined logical level (for example, a logical high level if the logical gate circuit is a NAND gate, or a logical low level if the logical gate circuit is a NOR gate). Therefore, when the output latched in the latch circuit is at a high level, all of series-connected MOS transistors in the logical gate circuit for the negated logical combination (NAND gate or NOR gate) are in no way off. Therefore, when the output of the logical gate circuit for the negated logical combination is brought from the high level to the low level, only one of the inputs of the logical gate circuit for the negated logical combination is turned on. Accordingly, the output pulling-down speed of the logical gate circuit for the negated logical combination can be made faster than that of the conventional latch circuit with logical operation function.

The above and other objects, features and advantages of the present invention will be apparent from the following description of preferred embodiments of the invention with reference to the accompanying drawings.

DESCRIPTION OF THE PREFERRED EMBODIMENTS

Figure 3:
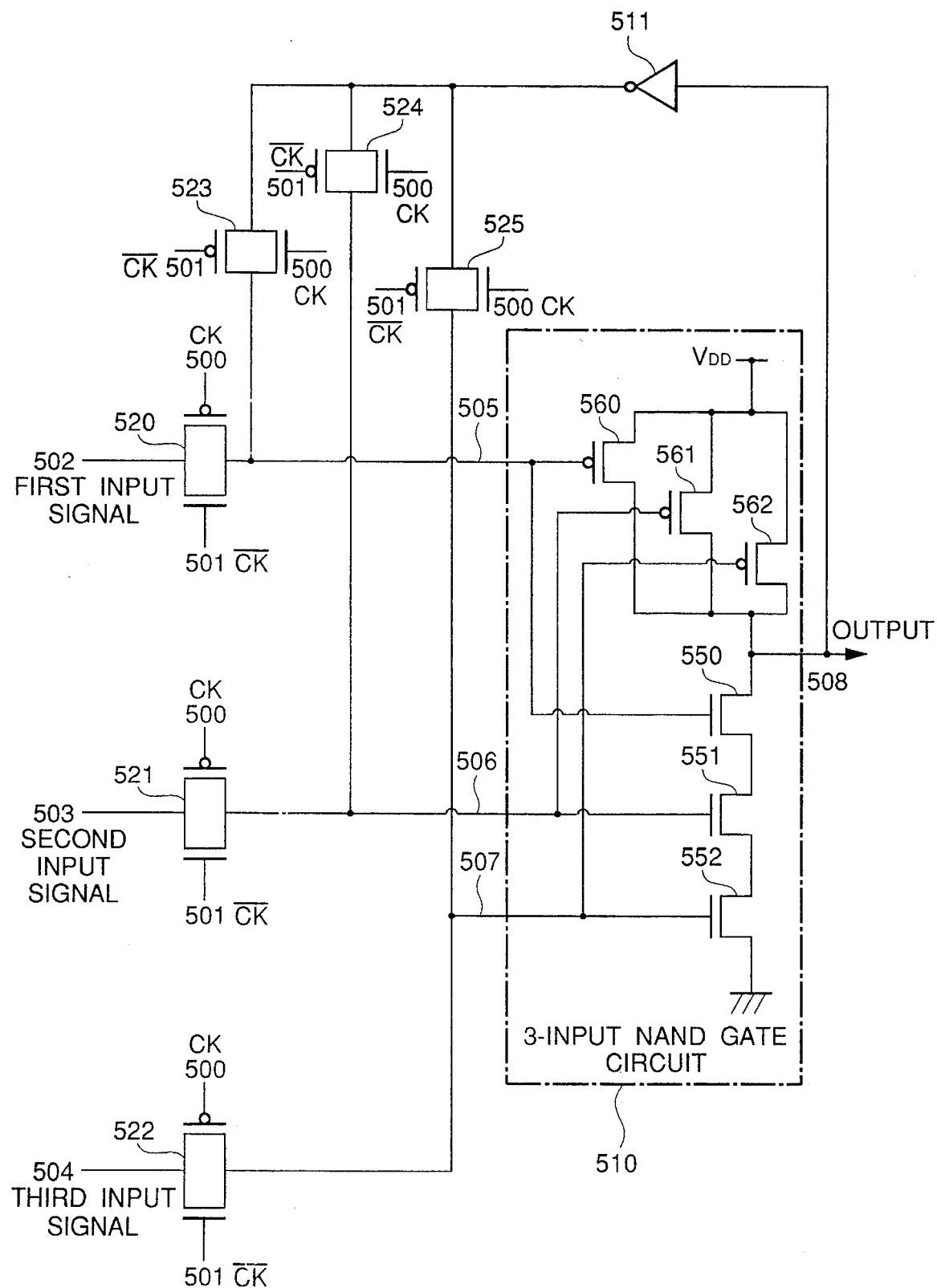
FIG. 3 is a circuit diagram of a conventional latch circuit with logical operation function.
Figure 5:
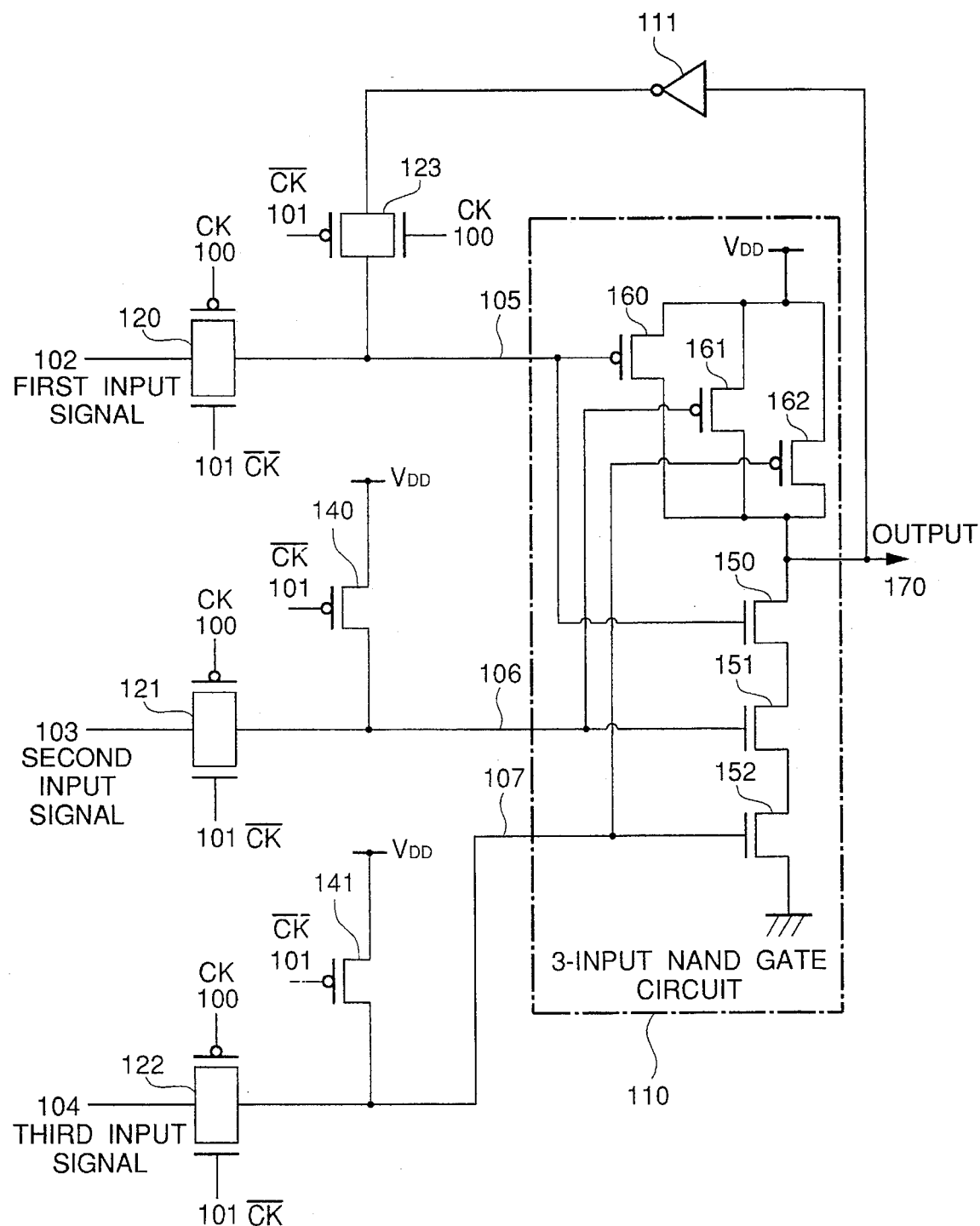
FIG. 5 is a circuit diagram of a first embodiment of the latch circuit with logical operation function in accordance with the present invention.

Referring to FIG. 5, there is shown a circuit diagram of a first embodiment of the latch circuit with logical operation function in accordance with the present invention, and having a logical function similar to that of the circuit shown in FIG. 3.

Therefore, similarly to the circuit shown in FIG. 3, the shown first embodiment of the latch circuit has a function of a three-input NAND circuit and a function of a latch circuit. First, second and third input signals 102, 103 and 104 are supplied to first, second and third inputs 105, 106 and 107 of a three-input NAND circuit 110 through first, second and third transfer gates 120, 121 and 122, respectively, which are controlled by a pair of complementary clock signals, namely, a non-inverted clock signal CK 100 and an inverted clock signal $\overline{CK}$ 101. An output 170 of the three-input NAND circuit 110 is connected to an input of a feedback inverter 111, which in turn has an output connected to the first input 105 of the three-input NAND circuit 110 through a fourth transfer gate 123 controlled by the pair of complementary clock signals CK 100 and $\overline{CK}$ 101. In addition, the second and third inputs 106 and 107 of the three-input NAND circuit 110 are pulled up to a high logical level voltage VDD through P-channel MOS transistors 140 and 141, respectively, which have their gate connected to receive the inverted clock signal $\overline{CK}$ 101 so as to function as a transfer gate.

Specifically, each of the first, second, third and fourth transfer gates 120,121,122 and 123 is composed of an N-channel MOS transistor and a P-channel MOS transistor which are connected in parallel and which have their gates connected to receive a pair of complementary clocks signals CK 100 and $\overline{CK}$ 101. More specifically, in each of the first, second and third transfer gates 120, 121 and 122, the gate of the P-channel MOS transistor is connected to receive the non-inverted clock signal CK 100, and the gate of the N-channel MOS transistor is connected to received the inverted clock signal $\overline{CK}$ 101. On the other hand, in the fourth transfer gate 123, the gate of the N-channel MOS transistor is connected to receive the non-inverted clock signal CK 100, and the gate of the P-channel MOS transistor is connected to receive the inverted clock signal $\overline{CK}$ 101.

Thus, the first, second, third and fourth transfer gates 120, 121, 122 and 123 and the P-channel MOS transistors 140 and 141 are controlled by the non-inverted clock signal CK 100 and the inverted clock signal $\overline{CK}$ 101 in such a manner that when the first, second and third transfer gates 120, 121 and 122 are opened or turned on, the fourth transfer gate 123 and the P-channel MOS transistors 140 and 141 are closed or turned off, and when the first, second and third transfer gates 120, 121 and 122 are closed or turned off, the fourth transfer gate 123 and the P-channel MOS transistors 140 and 141 are opened or turned on.

Figure 2:
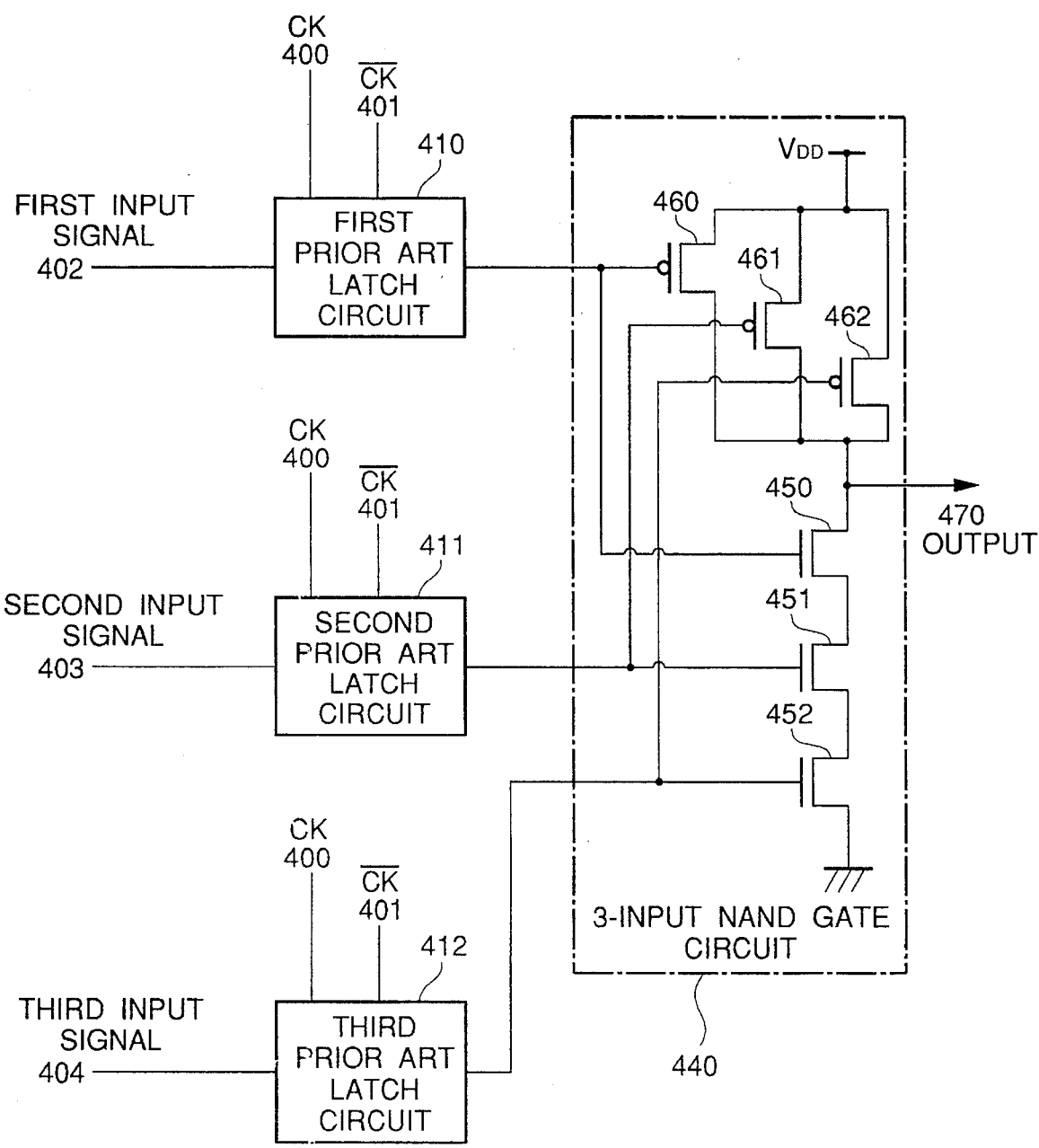
FIG. 2 is a circuit diagram of one example of an electronic circuit incorporating the prior art latch circuit shown in FIG. 1.

The three-input NAND circuit 110 is of a CMOS circuit, which is formed of first, second and third N-channel MOS transistors 150, 151 and 152 and first, second and third P-channel MOS transistors 160, 161 and 162, completely similarly to the three-input NAND circuit 410 shown in FIG. 2.

Figure 4:
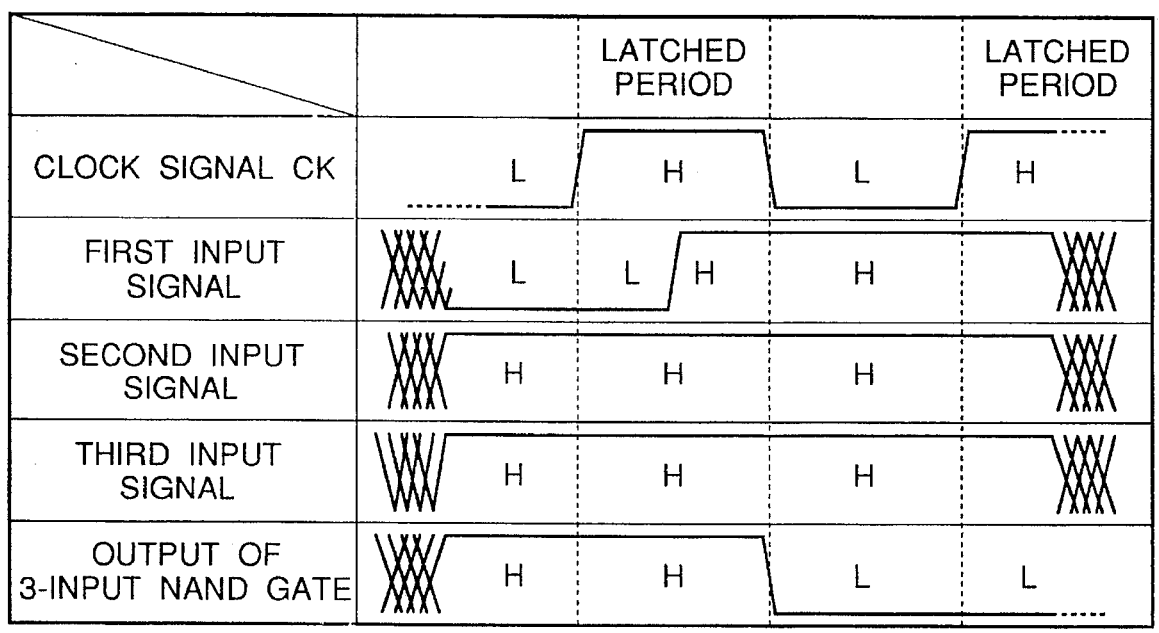
FIG. 4 is a timing chart illustrating a clock, input signal and output signal pattern in the latch circuit with logical operation function.

Assuming that the input signal pattern shown in FIG. 4 is applied, the latch circuit with logical operation function shown in FIG. 5 operates as follows:

In a latch period in which the clock signal CK 100 is at a high level, the first, second and third transfer gates 120, 121 and 122 are closed or off, and the fourth transfer gate 123 and the P-channel MOS transistors 140 and 141 are open or on. In this condition, the three-input NAND gate circuit 110 continues to hold a high level (H) as a negated logical product of "L, H, H" of the first, second and third input signals 102, 103 and 104 applied just before the clock signal CK 100 is brought to the high level. Therefore, the feedback inverter 111 outputs a low level (L), which is fed back to only one input 105 of the three inputs 105, 106 and 107 of the three-input NAND gate circuit 110, differently from the conventional latch circuit with logical operation function shown in FIG. 3. The remaining inputs 106 and 107 of the three-input NAND gate circuit 110 are supplied with a logical high level (VDD) through the first and second P-channel MOS transistors 140 and 141.

Therefore, of the three series-connected N-channel MOS transistors 150, 151 and 152 of the three-input NAND gate circuit 110, the N-channel MOS transistors 151 and 152 are maintained in an ON condition, and only the N-channel MOS transistor 150 is put into an OFF condition.

When the clock signal CK 100 changes from the high level (H) to the low level (L), the first, second and third transfer gates 120, 121 and 122 are opened or turned on, and the fourth transfer gate 123 and the P-channel MOS transistors 140 and 141 are closed or turned off. As a result, the three-input NAND gate circuit 110 receives the first, second and third input signals 102, 103 and 104 of "H, H, H". At this time, the N-channel MOS transistor 150 of the three-input NAND gate circuit 110 is caused to change from the OFF condition to the ON condition, with the result that the three-input NAND gate circuit 110 outputs a low level signal (L), since the other N-channel MOS transistors 151 and 152 of the three-input NAND gate circuit 110 are already in the ON condition by function of the P-channel MOS transistors 140 and 141 as mentioned above.

Accordingly, a series resistance of the series-connected N-channel MOS transistors 150, 151 and 152 for pulling down the output 170 of the three-input NAND gate circuit 110 is smaller than that of the conventional latch circuit with logical operation function as shown in FIG. 3. As a result, the delay time in the output pulling-down operation can be shortened.

In the above mentioned embodiment, the output of the feedback inverter 111 is connected to the first input 105 of the three-input NAND gate circuit 110, but may be connected to the second input 106 or the third input 107 of the three-input NAND gate circuit 110. However, it is possible to most effectively shorten the delay time, by connecting the output of the feedback inverter 1111 to one of the series-connected N-channel MOS transistors nearest to the output 170 of the three-input NAND gate circuit 110.

Figure 6:
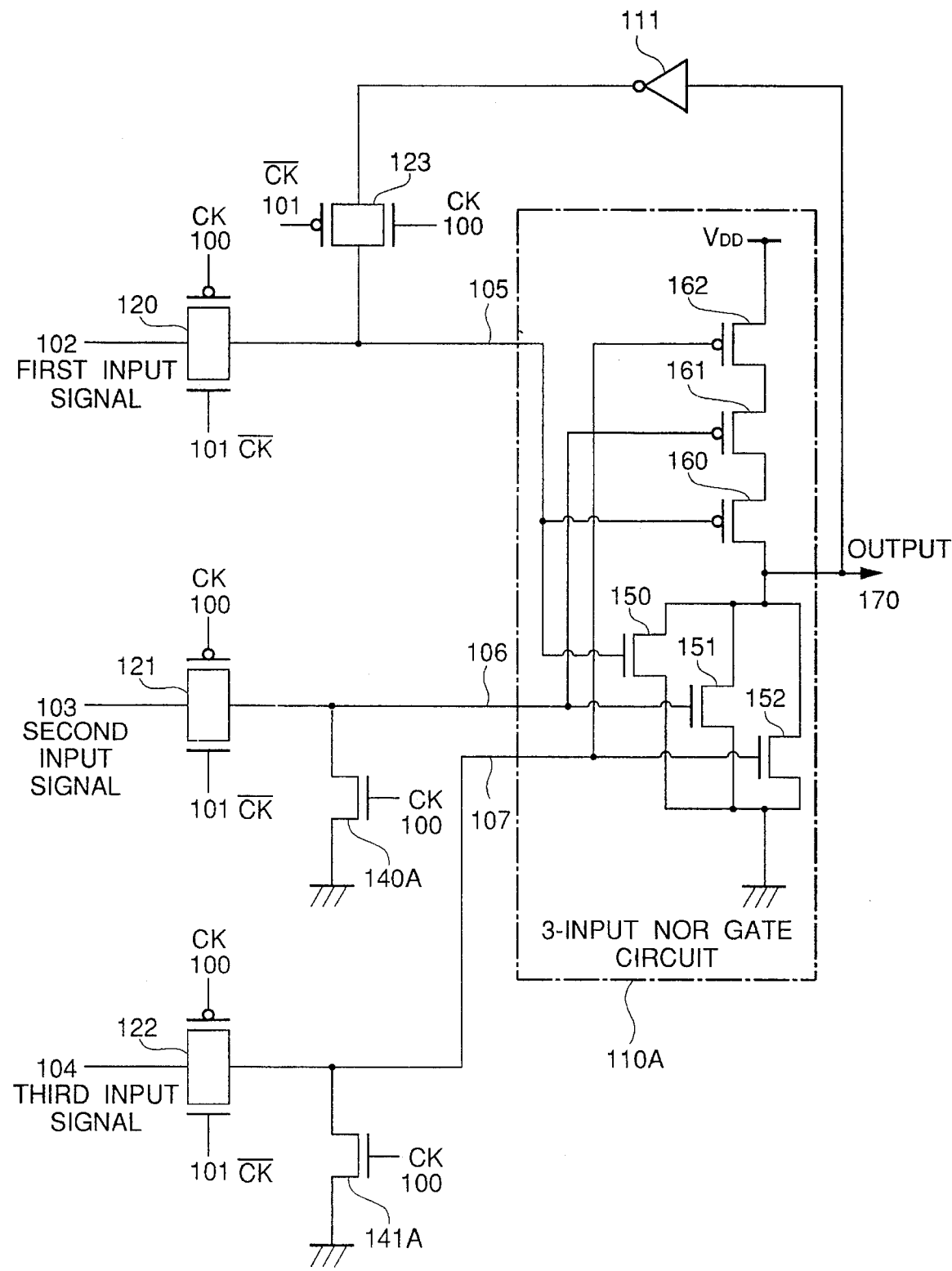
FIG. 6 is a circuit diagram of a second embodiment of the latch circuit with logical operation function in accordance with the present invention.

In the first embodiment shown in FIG. 5, the NAND gate circuit 110 is incorporated, but can be replaced by a CMOS type NOR gate circuit 110A as shown in FIG. 6. In FIG. 6, elements corresponding or similar to those shown in FIG. 5 are given the same Reference Numerals, and explanation thereof will be omitted.

In the NOR gate circuit 110A, the three P-channel MOS transistors 160, 161 and 162 are connected in series between the high voltage VDD and an output 170 of the NOR gate circuit 110A, and the three N-channel MOS transistors 150, 151 and 152 are connected in parallel to each other between the ground and the output 170 of the NOR gate circuit 110A. The second and third inputs 106 and 107 of the NOR gate circuit 110A are pulled down to the ground through N-channel MOS transistors 140A and 141A, respectively, having their gate connected to receive the non-inverted clock signal CK 100.

Since operation of the embodiment shown in FIG. 6 will be apparent to persons skilled in the art, explanation thereof will be omitted.

In this embodiment shown in FIG. 6, the output of the feedback inverter 111 is connected to the first input 105 of the three-input NOR gate circuit 110A, but may be connected to the second input 106 or the third input 107 of the three-input NOR gate circuit 110A. However, it is possible to most effectively shorten the delay time, by connecting the output of the feedback inverter 111 to one of the series-connected P-channel MOS transistors nearest to the output 170 of the three-input NOR gate circuit 110A.

As seen from the above, the latch circuit with logical operation function in accordance with the present invention is characterized in that only one MOS transistor of the series-connected MOS transistors in the NAND or NOR gate circuit is switched when the circuit changes from the latched condition to a non-latched condition, regardless of the number of the series-connected MOS transistors. Therefore, the present invention can be applied not only to the latch circuit with a three-input NAND or NOR logic function as mentioned above, but also to any latch circuit having a two-input NAND or NOR logic function or a more than three input NAND or NOR logic function.

Figure 1:
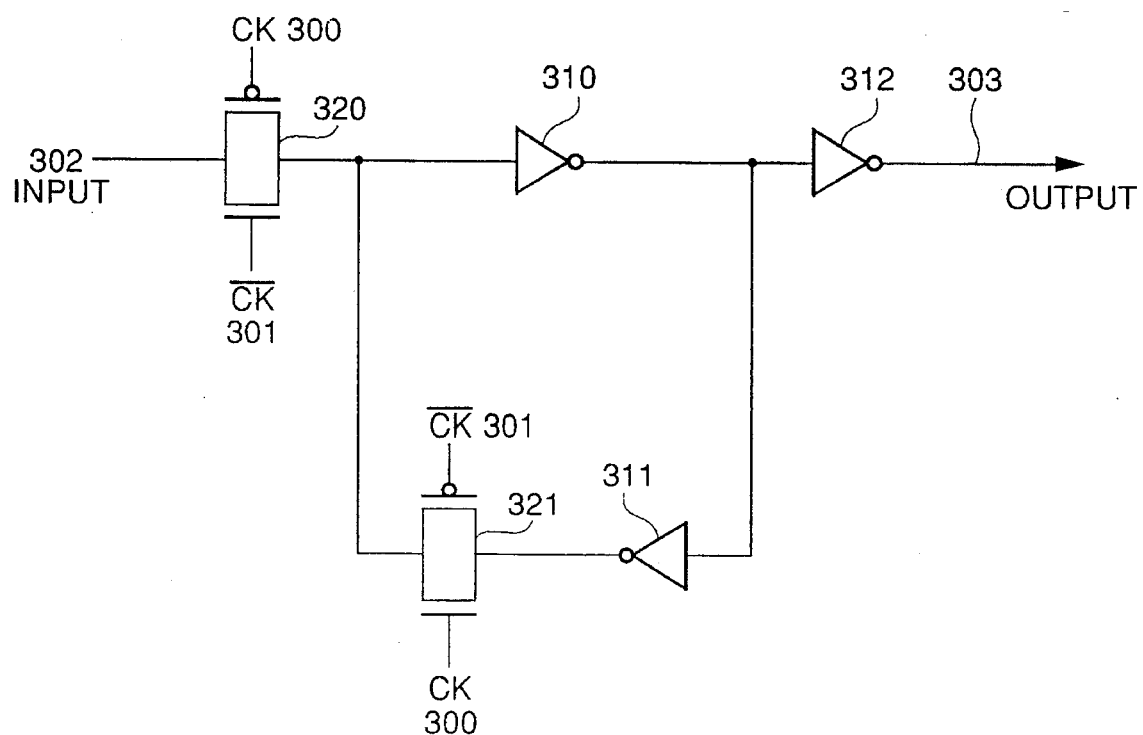
FIG. 1 is a circuit diagram of a typical latch circuit in the prior art.

The above mentioned latch circuit with logical operation function in accordance with the present invention has the following three advantages: (1) Since the logical operation function is realized in the latch circuit, a high speed operation can be realized. For example, if the latch circuit with logical operation function in accordance with the present invention is used as a pipeline latch in a pipelined arithmetic and logic stage, it is possible to delete a logic gate in a pipelined stage succeeding to the pipelined arithmetic and logic stage, since it is possible to incorporate a necessary logic stage in the latch circuit. (2) Since the logical operation function is realized in the latch circuit, it is possible to reduce the number of requires elements. For example, the circuit as shown in FIG. 2 having the three latch circuits and the NAND gate circuit requires 36 transistors, since each one latch circuit as shown in FIG. 1 requires ten transistors. On the other hand, the latch circuit with logical operation function in accordance with the present invention having the same function needs only 18 transistors. (3) Since only one MOS transistor of the series-connected MOS transistors in the NAND or NOR gate circuit is switched, differently from the conventional latch circuit with logical operation function, a series resistance at the time of a pulling-down can be made small, and therefore, it is possible to speed up the operation.

The invention has thus been shown and described with reference to the specific embodiments. However, it should be noted that the present invention is in no way limited to the details of the illustrated structures but changes and modifications may be made within the scope of the appended claims.

I claim:

1. A latch circuit with a logical operation function, comprising:

a first input terminal for receiving a first input signal;

a second input terminal for receiving a second input signal;

a logical gate circuit having a first input and a second input and an output for outputting a negated logical combination of said first input and said second input;

a first transfer gate connected between said first input terminal and said first input of said logical gate circuit;

a second transfer gate connected between said second input terminal and said second input of said logical gate circuit;

an inverter having an input connected to said output of said logical gate circuit;

a third transfer gate connected between an output of said inverter and said first input of said logical gate circuit such that said output of said logical gate circuit is fed back to only said first input of said logical gate circuit when said third transfer gate is turned on; and a fourth transfer gate connected between said second input of said logical gate circuit and a predetermined fixed logical level voltage such that said second input of said logical gate circuit is forcibly brought to said predetermined fixed logical level voltage, independently from said output of said logical gate circuit, when said fourth transfer gate is turned on, said first, second, third and fourth transfer gates being controlled by a clock signal in such a manner that when said first and second transfer gates are on, said third and fourth transfer gates are off, and when said first and second transfer gates are off, said third and fourth transfer gates are on, wherein when said first and second transfer gates are on and said third and fourth transfer gates are off, said logical gate circuit performs a predetermined logical operation in response to said first input signal applied to said first input terminal and said second input signal applied to said second input terminal, and when said first and second transfer gates are off and said third and fourth transfer gates are on, said output of said logical gate circuit is fed back to only said first input of said logical gate circuit through said inverter and said third transfer gate, and said second input of said logical gate circuit is forcibly brought to said predetermined fixed logical level voltage, regardless of a logic level of said output of said logical gate circuit, so that a latch operation is performed to maintain a logical value on said output of said logical gate circuit.

2. A latch circuit claimed in claim 1 wherein said logical gate circuit is a NAND gate circuit, and said predetermined fixed logical level voltage is a logical high level.

3. A latch circuit claimed in claim 2 wherein each of said first, second and third transfer gates is composed of an N-channel MOS transistor and a P-channel MOS transistor connected in parallel to each other and controlled by a pair of complementary clock signals, and said fourth transfer gate is composed of only a P-channel MOS transistor.

4. A latch circuit claimed in claim 2 wherein said NAND gate circuit includes a plurality of series-connected N-channel MOS transistors connected between an output of said NAND gate circuit and ground, and a corresponding number of parallel-connected P-channel MOS transistors connected between a high voltage and said output of said NAND gate circuit, and wherein said output of said feedback inverter is connected to one of said series-connected N-channel MOS transistors nearest to said output of said NAND gate circuit.

5. A latch circuit claimed in claim 1 wherein said logical gate circuit is a CMOS type NOR gate circuit, and said predetermined fixed logical level voltage is a logical low level.

6. A latch circuit claimed in claim 5 wherein each of said first, second and third transfer gates is composed of an N-channel MOS transistor and a P-channel MOS transistor connected in parallel to each other and controlled by a pair of complementary clock signals, and said fourth transfer gate is composed of only an N-Channel MOS transistor.

7. A latch circuit claimed in claim 5 wherein said NOR gate circuit includes a plurality of parallel-connected N-channel MOS transistors connected between an output of said NOR gate circuit and ground, and a corresponding number of series-connected P-channel MOS transistors connected between a high voltage and said output of said NOR gate circuit, and wherein said output of said feedback inverter is connected to one of said series-connected P-channel MOS transistors nearest to said output of said NOR gate circuit.

* * * * *